United States Patent [19]
Ooiwa

[11] Patent Number: 5,677,616
[45] Date of Patent: Oct. 14, 1997

[54] RECTIFYING AND VOLTAGE REGULATING UNIT OF AC GENERATOR AND METHOD OF MAKING THE SAME

[75] Inventor: Tooru Ooiwa, Toyota, Japan

[73] Assignee: Nippondenso Co., Ltd., Kariya, Japan

[21] Appl. No.: 657,678

[22] Filed: May 31, 1996

[30] Foreign Application Priority Data

Jun. 2, 1995 [JP] Japan ................................. 7-136550

[51] Int. Cl.$^6$ ................................................. H02P 9/00
[52] U.S. Cl. ........................... 322/17; 322/28; 310/68 R
[58] Field of Search ............................. 322/25, 26, 17, 322/28; 310/68 R

[56] References Cited

U.S. PATENT DOCUMENTS

| | | | |
|---|---|---|---|
| 4,161,775 | 7/1979 | Franz et al. | 363/145 |
| 4,504,752 | 3/1985 | Iwaki et al. | 310/68 R |
| 4,799,309 | 1/1989 | Cinzori et al. | 29/596 |
| 4,899,209 | 2/1990 | Shibata et al. | 357/74 |
| 5,043,614 | 8/1991 | Yockey | 310/68 D |
| 5,315,195 | 5/1994 | Bradfield et al. | 310/89 |
| 5,550,415 | 8/1996 | Adachi et al. | 310/68 R |

FOREIGN PATENT DOCUMENTS

| | | |
|---|---|---|
| 56-057681 | 10/1954 | Japan. |
| 51-041514 | 11/1976 | Japan. |
| 4-138030 | 5/1992 | Japan. |

*Primary Examiner*—Steven L. Stephan
*Assistant Examiner*—Nicholas Ponomarenko
*Attorney, Agent, or Firm*—Cushman, Darby & Cushm IP Group of Pillsbury Madison & Sutro LLP

[57] ABSTRACT

In a rectifying and voltage regulating unit of an AC generator, an AC input terminal, a DC output terminal, and an insulating member holding the respective terminals are commonly used by a rectifier and a voltage regulator so that a terminal block of the rectifier, a terminal block of the voltage regulator and a connector can be simultaneously molded in a single resin mold and no specific fastening member is necessary. The environmental resistibility of electrically connecting sections of the rectifier and the voltage regulator is enhanced by keeping the connecting sections from exposure by means of sealing the AC input terminal and the DC output terminal with the insulating member.

8 Claims, 11 Drawing Sheets

5,677,616

RECTIFYING AND VOLTAGE REGULATING UNIT OF AC GENERATOR AND METHOD OF MAKING THE SAME

CROSS REFERENCE TO RELATED APPLICATION

The present application is based on and claims priority from Japanese Patent Application No. Hei 7-136550, filed on Jun. 2, 1995, the contents of which are incorporated herein by reference.

BACKGROUND OF THE INVENTION

1. Field of the Invention

This invention relates to a rectifying and voltage regulating unit of an AC generator for supplying power to electrical equipment mounted on a vehicle and charging a battery mounted on the vehicle and a method for making the same and, more particularly, to an alternator wherein a rectifier and a voltage regulator are provided integrally with an AC generator itself.

2. Description of the Related Art

There has been known an alternator (conventional type), wherein an AC generator for vehicle, for example, is provided with a rectifier 100 for rectifying AC outputs from stator coils into a DC output and a voltage regulator 200 for regulating a output voltage by detecting the output voltages of the stator coils and controlling exciting current through the supply of a part of the output current to exciting coils as shown in FIGS. 13 and 14.

The conventional rectifier 100 comprises a cooling fin 102 on the positive side, holding a plurality of rectifying devices 101 on the positive side, a cooling fin 104 on the negative side, holding a plurality of rectifying devices 103 on the negative side, a terminal block 105 disposed on the side closer to the AC generator than the cooling fin 102 on the positive side, etc. The terminal block 105 is provided with an AC input terminal 106 for electrically connecting the rectifying devices 101 on the positive side, the rectifying devices 103 on the negative side, and armature coils (not shown) together; and a DC output terminal on the positive side (not shown) for electrically connecting a DC output terminal 107 on the positive side, a brush inside a brush holder 301, the cooling fin 102 on the positive side, and a voltage regulator 200 together.

The conventional voltage regulator 200 comprises a housing 201 for housing an IC (not shown), cooling fins 202 fixedly attached to one side of the housing 201, etc.; and the housing 201 comprises a connector surrounding three external input/output terminals 203–205 and a shield case 210 provided with connecting terminals 207–209, of which the connecting terminal 207 is a DC output terminal on the positive side, the connecting terminal 208 an AC input terminal for detecting power generation, and the connecting terminal 209 an output terminal for exciting current.

In light of various functions as stated above, it is essential to connect electrically the rectifier 100 to the voltage regulator 200. Accordingly, the DC output terminal on the positive side of the rectifier 100, the connecting terminal 207 of the voltage regulator 200, and a brush terminal 302 inside the brush holder 301 are electrically connected with each other by joining them fixedly with a screw 303; the AC input terminal 108 of the rectifier 100 is electrically connected to the connecting terminal 208 of the voltage regulator 200 by joining them fixedly with a screw 304 and a screw 305 is for electrically connecting the connecting terminal 209 to a brush terminal 306 inside the brush holder 301.

In the conventional AC generator, the rectifier is connected to the voltage regulator by the screws 303 and 304, making it impossible to keep such connecting sections from exposure. Consequently, there is a risk of electrolytic corrosion taking place in such a severe environment as is encountered by an AC generator disposed in close proximity to an engine which is heated up during driving, that is, high in both temperature and moisture and at a risk of being splashed with water as the case may be. Accordingly, there arises the need of spacing widely between the exposed parts or applying an extra insulating means such as additional painting, etc., which creates problems such as the enlargement of the overall construction of an AC generator for vehicle or an increase in the production cost thereof.

Furthermore, both the rectifier 100 and the voltage regulator 200 require a DC output terminal on the positive side, the connecting terminal 207, the AC input terminal 108, and the connecting terminal 208, respectively. In addition, the connecting sections become larger in size to ensure the shape thereof to be suited for connection, for example, threaded sections, requiring a thread forming process and parts for connection such as screws. All the above has led to the larger size of the overall construction and a higher production cost; an increase in the number of components used has resulted in a lower productivity.

SUMMARY OF THE INVENTION

It is an object of the present invention to provide a rectifying and voltage regulating unit of an AC generator wherein electrically connecting sections of a rectifier and a voltage regulator can be reduced in size and the number of components used can be reduced through common use of the connecting member and the holding member of the rectifier and the voltage regulator, contributing to improvement of the productivity.

Further object of the invention is to provide a rectifying and voltage regulating unit of an AC generator wherein the environmental resistibility of electrically connecting sections of the rectifier and the voltage regulator can be enhanced by covering the connecting member with the holding member.

Still further object of the invention is to provide a rectifying and voltage regulating unit of an AC generator wherein a reduction in the size thereof or utilization of dead space can be achieved by increasing flexibility in the arrangement of adjacent electrically charged parts.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Hereafter, the preferred embodiments of the rectifying and voltage regulating unit of an AC generator according to the present invention as applied to an alternator for vehicle will be explained by way of embodiments with reference to drawings.

First Embodiment

Figure 1:
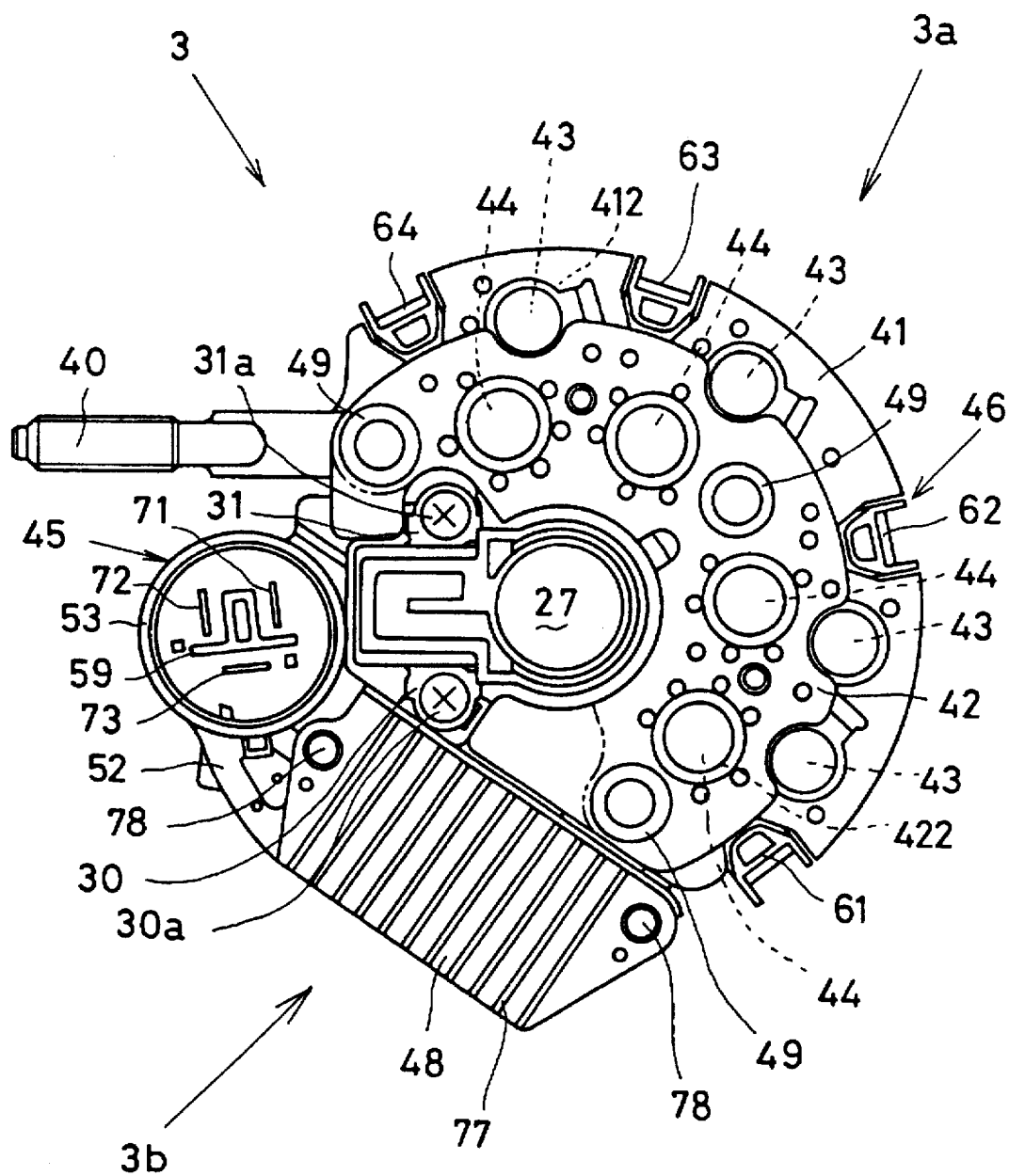
FIG. 1 is a plan view of a rectifying and voltage regulating unit of an alternator for a vehicle according to a first embodiment of the present invention.
Figure 2:
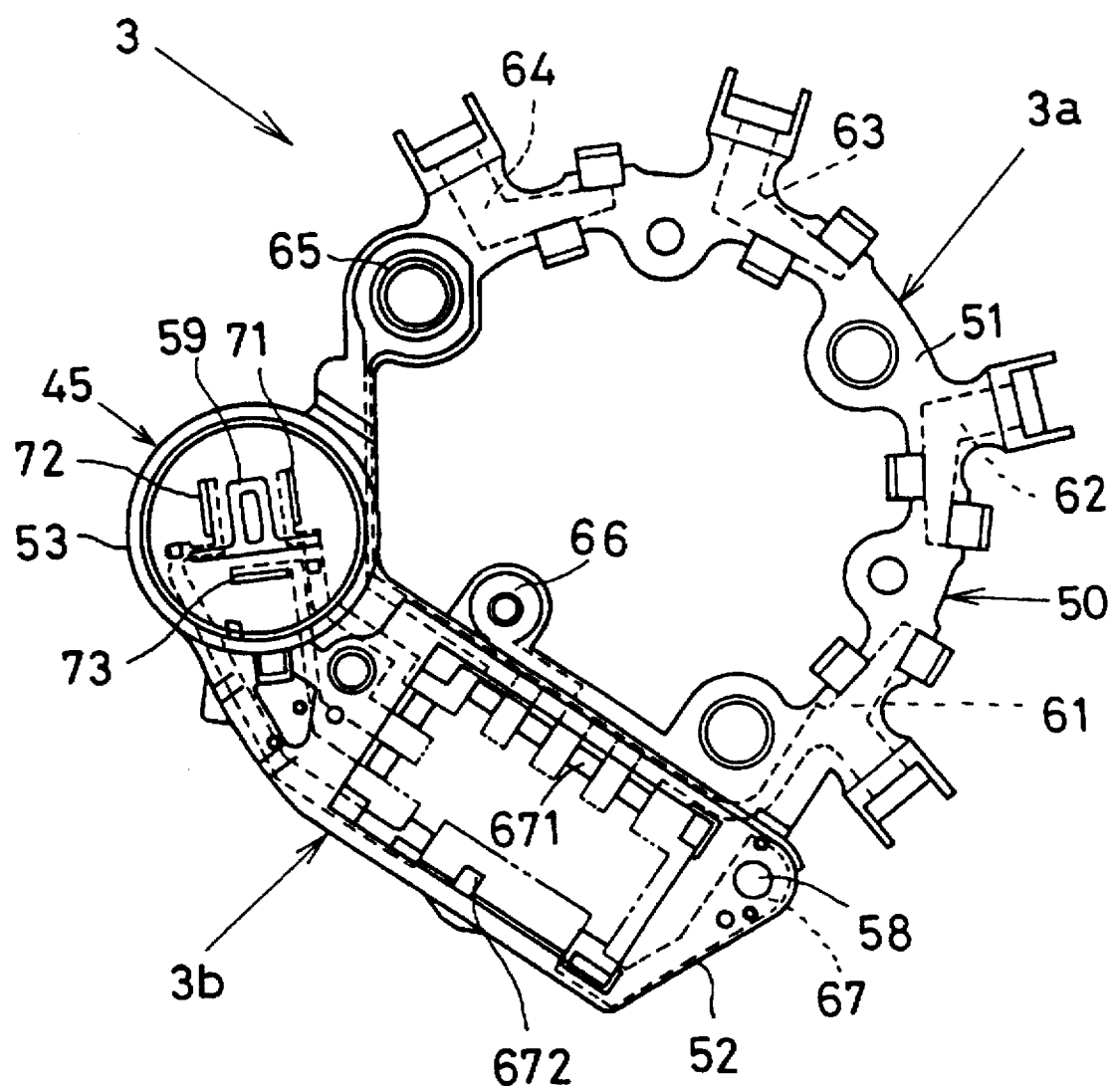
FIG. 2 is a plan view showing the insulating member of the rectifying and voltage regulating unit of FIG. 1.
Figure 3:
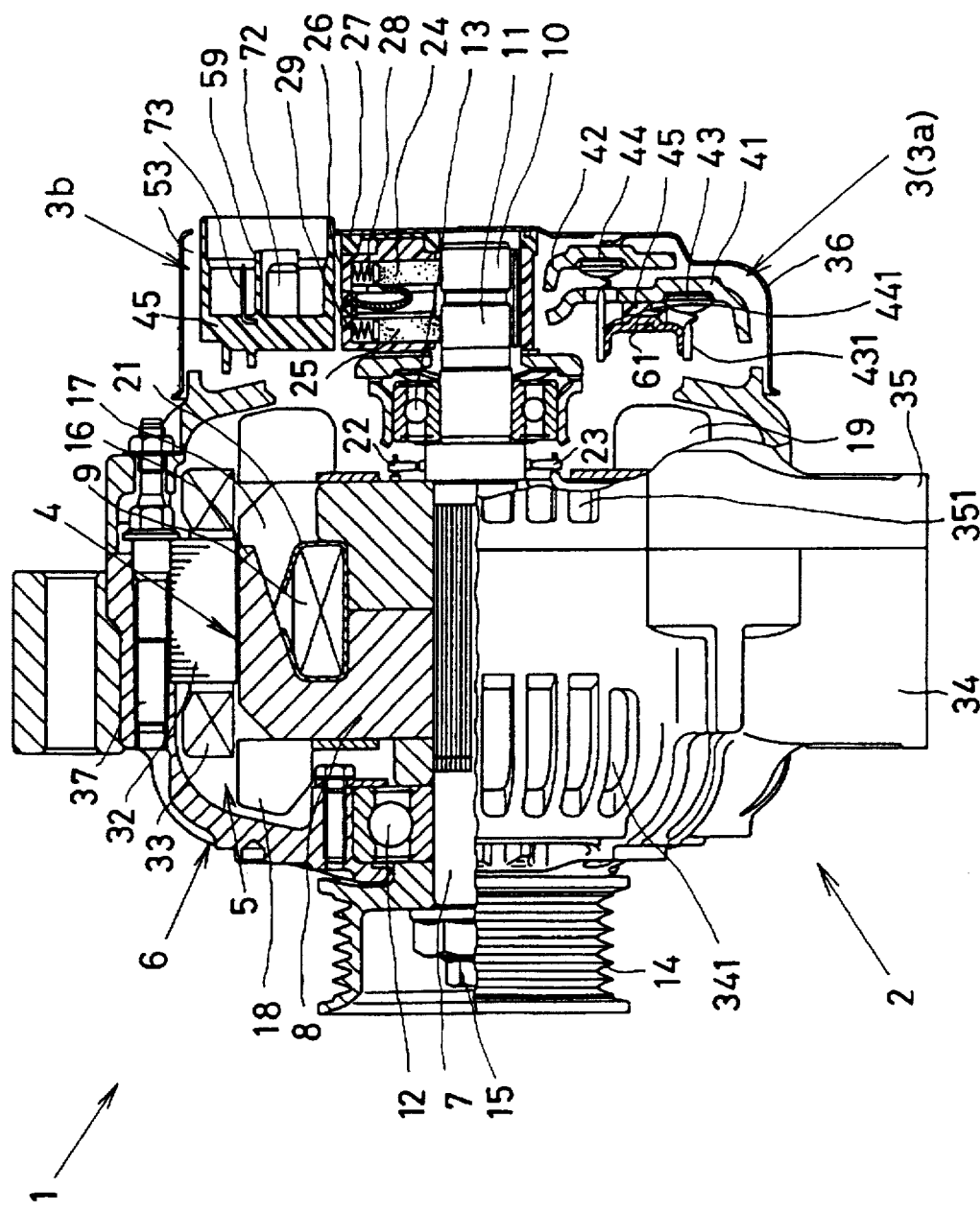
FIG. 3 is a sectional view of an alternator for vehicle showing the overall construction.

FIGS. 1–6 illustrate a first embodiment of the preferred embodiments of the invention, showing a rectifying and voltage regulator of an alternator for vehicle, an insulating member thereof, and an overall construction of the alternator for vehicle in FIG. 1, FIG. 2, and FIG. 3, respectively.

An alternator 1 for vehicle is a charging generator for vehicle which is used for charging a battery mounted on a vehicle and also supplying power to electrical equipment mounted on the vehicle and comprises an AC generator 2 for generating alternating current, a rectifying and voltage regulating unit 3 provided integrally with the AC generator 2 on the rear side thereof, etc.

Referring now to FIG. 3, the AC generator 2 of the alternator 1 for vehicle is explained. The AC generator 2 is provided mainly with a rotor 4 driven for rotation, a stator 5 rotatable relative to the rotor 4, and a housing 6 and generates electric power by rotational driving force.

The rotor 4 is carried integrally by a shaft (rotatory shaft) 7 and is provided with pole cores 8 in a Lundell type (also referred to as field pole, field core, or rotor core), a field coil 9 (also referred to as rotor coil) and two slip rings 10 and 11, etc.

The shaft 7 is rotatably held by means of a front bearing 12 and a rear bearing 13 on the inner peripheral side of the housing 6 and a V ribbed pulley 14 (pulley for a multi-V belt) for transmission of the rotational power of the engine to the shaft 7 is secured to one end (the front end) of the shaft 7 with a washer based nut 15. The V ribbed pulley 14 is interlocked with a pulley for a multi-V belt (not shown) coupled to a driving shaft of the engine through a power transmission means (not shown) such as a multi-V belt. Alternatively, the shaft 7 may be interlocked with the driving shaft of the engine directly or through such a power transmission means interposed therebetween as a variable speed gear of more than one step, a V belt type continuous variable speed gear or the like.

Each of the pole cores 8 is provided with the field coil 9 wound around its center portion and when exciting current flows through the field coil 9, all of claw pole shoes 16 on one side turn into the north magnetic pole and all of the same 17 on the other side the south magnetic pole. A cooling fan (axial flow type fan) 18 for sucking in cool air into the housing 6 is attached by means of welding or the like to the internal wall opposite to the claw pole shoes 16 on one side and another cooling fan (centrifugal type) 19 for sucking in cool air into the housing 6 and blowing cool air onto the stator 5 is attached by means of welding or the like to the internal wall behind the claw pole shoes 17 on the other side.

The field coil 9 are wound around a coil bobbin 21 disposed at the center part of the pole core 8 and both ends of the field coil 9 are electrically connected to shaft connection bars of slip ring terminals 22 and 23, respectively; the connecting sections between the terminals of the field coil 9 and the shaft connection bars 22 and 23 are covered with an electrically insulating material (not shown) such as epoxy resin or the like.

Two slip rings 10 and 11 are attached to the circumferential surface of the shaft 7 at the rear end and the circumferential surfaces of respective slip rings are kept in slidable contact with two brushes 24 and 25, respectively, which are housed in brush holders 26 and 27, respectively, and kept pressed against the circumferential surfaces of the two slip rings 10 and 11 by coil springs 28 and 29 respectively. The two brushes 24 and 25 are electrically connected to terminals 30 and 31, respectively, which are insert-molded with the brush holder 26; the brush holder 26 is made of resin whereas the brush holder 27 is made of rubber, functioning to protect the brushes 24 and 25 from getting splashed with water.

The stator 5 is composed of an armature core (also referred to as stator core) 32 disposed opposite the circumferential surfaces of a pair of the claw pole shoes 16 and 17 of the pole core 8, and three-phase armature coils (also referred to as stator coils) 33 wound around the armature core 32, etc.

The armature core 32 is a laminated core formed with a plurality of layers of thin magnetic steel sheet and integrally formed with the internal peripheral surface of the housing 6 after being pushed therein. The armature core 32 creates magnetic flux path such that the magnetic fluxes emanating from a pair of the claw pole shoes 16 and 17 of the pole core 8 can cross effectively the three-phase armature coils 33 and on the internal peripheral surface of the armature core 32 are formed a plurality of slots (not shown) at equal spacings. The three-phase armature coils 33 are the stator coils having Star connection or Δ connection so that three-phase AC outputs are induced by the rotation of the rotor 4.

The housing 6 comprises a drive frame (also referred to as front housing) 34, a rear frame (also referred to as rear housing) 35, a rear cover 36, etc. The drive frame 34 integrally formed from aluminum die casting holds rotatably the rotor 4 at one end, coupling it with the engine and is provided with a plurality of ventilation openings 341, through which cool air is sucked in by the rotation of the cooling fans 18 and 19.

The rear frame 35 integrally formed from aluminum die casting also holds rotatably the rotor 4 at the other end, coupling it with the engine and is provided with a plurality of ventilation openings 351, through which cool air is sucked in by the rotation of the cooling fans 18 and 19; the rear frame 35 is fixedly attached to the drive frame 34 by a fastening means such as a plurality of stud bolts and nuts.

The rear cover 36 is integrally formed by press forming a sheet of metal such as aluminum, etc. Between the rear frame 35 and the rear cover 36, a rectifying and voltage regulating unit 3 one end of the shaft 7, the two slip rings 10 and 11, the two brushes 24 and 25, and the brush holders 26 and 27 are housed. The rear cover 36 is also provided with a plurality of ventilation openings (not shown) for cool air sucked in by the rotation of the cooling fans 18 and 19 and body-earthed (grounded) functioning as a DC output terminal on the negative side of a rectifier 3a as stated hereafter.

Now referring to FIGS. 1–6, the rectifying and voltage regulating unit 3 of the alternator 1 for vehicle is explained. The rectifying and voltage regulating unit 3 comprises a rectifier 3a and a voltage regulator 3b. The rectifier 3a is provided with a DC output terminal 40, a cooling fin 41 on the plus side, a cooling fin 42 on the minus side, four diodes 43 on the plus side, four diodes 44 on the minus side, an insulating member 45, a lead frame 46, etc. while the voltage regulator 3b (a so-called M-type IC regulator) is provided with the insulating member 45, the lead frame 46, a hybrid IC 47, a cooling fan 48, etc. It will be noted that the insulating member 45 and the lead frame 46 are in common use by the rectifier 3a and the voltage regulator 3b.

The DC output terminal 40 (also referred to as DC output + terminal or B terminal bolt) is electrically connected at one end to a positive terminal of a battery via a lead wire (not shown) and at the other end to a DC output terminal 65 stated hereafter (refer to FIGS. 2 and 6) and the cooling fin 41 on the plus side by tightening up a screw (not shown). The DC output terminal 40 is a terminal for supplying electric current to charge the battery, forming B terminal of the alternator 1 for vehicle.

The cooling fin 41 on the plus side is integrally formed in a predetermined shape (in a form resembling the letter C) so as to surround the brush holders 26 and 27 and disposed behind the rear frame 35 so as to run along the rear surface thereof. The cooling fin 42 on the minus side is integrally formed in a predetermined shape (in a form resembling the letter C) so as to surround the brush holders 26 and 27 and disposed on the side closer to the rear cover 36 than the cooling fin 41 on the plus side. As shown in FIG. 3, the cooling fin 42 on the minus side is body-earthed (grounded) through contact with the rear cover 36, setting up an electrically charged section together with the cooling fin 41 on the plus side, that is, the cooling fin 41 on the plus side is electrically connected to the positive (+) terminal of the battery and the cooling fin 42 on the minus side to the negative (−) terminal of the battery.

The cooling fin 41 on the plus side and the cooling fin 42 on the minus side are made from an electrically conductive metal sheet (for example, aluminum sheet) of excellent thermal conductivity, respectively, and are provided with radiation fin parts, 411 and 421, for radiation of heat generated by the four diodes 43 on the plus side and the four diodes 44 on the minus side, respectively, functioning as a means for holding rectifying devices wherein the four diodes 43 on the plus side and the four diodes 44 on the minus side are securely held inside four recesses 412 and 422, respectively.

The cooling fin 41 on the plus side and the cooling fin 42 on the minus side are provided with three through-holes, respectively, and linked with each other in a state of electrical insulation from each other, maintaining a predetermined spacing, therebetween by three pipe rivets 49 inserted into each of the through-holes, respectively, and an insulating member 45; fastening members such as bolts (not shown) to be tightened up for fixedly attaching the cooling fin 41 on the plus side and the cooling fin 42 on the minus side to the rear frame 35 are inserted into the three pipe rivets 49, respectively.

The four diodes 43 on the plus side and the four diodes 44 on the minus side are the rectifying devices (the semiconductor devices of the rectifier 3a) for converting the AC outputs of the three-phase armature coils 33 into a DC output through rectification.

The four diodes 43 on the plus side are the diodes on the positive side electrically connected by means of soldering or the like to circular recesses 412, respectively, which are formed on the front side of the cooling fin 41 on the plus side and the recesses 412 of the cooling fin 41 on the plus side looked bulged towards the foreground in FIG. 1. The four diodes 44 on the minus side are the diodes on the negative side electrically connected by means of soldering or the like to circular recesses 422, respectively, which are formed on the front side of the cooling fin 42 on the minus side and the recesses 422 of the cooling fin 42 on the minus side looked bulged towards the foreground in FIG. 1.

Figure 4:
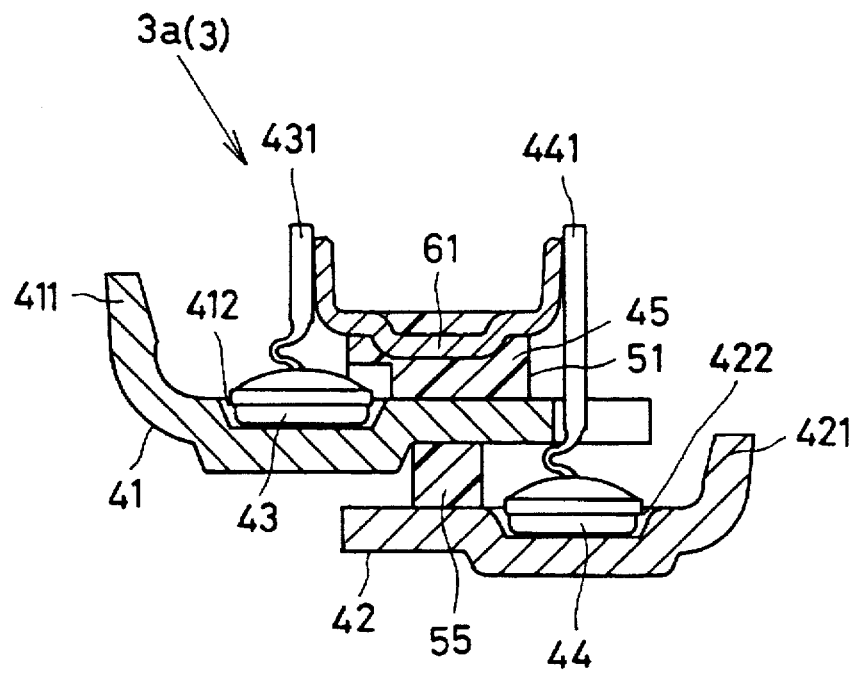
FIG. 4 is a sectional view showing the rectifier of FIG. 1.

As shown in FIGS. 3 and 4, lead wires 431 and 442, respectively, of a first diode 43 on the plus side and a first diode on the minus side are electrically connected to an AC input terminal 61 (refer to FIGS. 2 and 6) stated hereafter by means of soldering or the like.

Lead wires (not shown) of a second diode 43 on the plus side and a second diode on the minus side are electrically connected to an AC input terminal 62 (refer to FIGS. 2 and 6) by means of soldering or the like.

Lead wires (not shown) of a third diode 43 on the plus side and a third diode 44 on the minus side are electrically connected to an AC input terminal 63 (refer to FIGS. 2 and 6) stated hereafter by means of soldering or the like.

Lead wires (not shown) of a fourth diode 43 on the plus side and a fourth diode 44 on the minus side are electrically connected to an AC input terminal 64 (refer to FIGS. 2 and 6) stated hereafter by means of soldering or the like.

The insulating member 45 is made of electrically insulating resin with high strength and high dimensional stability, for example, polyphenylene sulfide resin (PPS resin), etc. and integrally formed substantially in an annular shape for use as an sealing member (also referred to as housing or body) for partially sealing the lead frame 46. The insulating member 45 is a component member of a terminal block 51 of the rectifier 3a, a terminal block (shield case) 52 of the voltage regulator 3b, provided integrally with the terminal block 51 on one side thereof, and a connector 53 of the voltage regulator 3b, formed integrally with the terminal block 51 and the terminal block 52.

The terminal block 51 in a sheet form resembling the letter C is an insulating means of the cooling fins for electrically insulating the cooling fin 41 on the plus side from the cooling fin 42 on the minus side is disposed closer to the rear frame 35 than the cooling fin 41 on the plus side and provided with three projections and a plurality of insulating wall sections (provisionally securing parts) 55 projected towards the cooling fin 42 on the minus side for securing provisionally the cooling fin 42 on the minus side to the cooling fin 41 on the plus side. The three projections are extended through the through-holes of the cooling fin 41 on the plus side and the tip ends of the three projections are inserted between the cooling fin 42 on the minus side and the pipe rivets 49. A plurality of the insulating wall sections 55, each having the shape of a cylinder or square cylinder act as a fin connection means for securing the cooling fin 41 on the plus side to the cooling fin 42 on the minus side by screws (not shown) inserted therein and also as an insulation distance holding means for maintaining a predetermined insulation distance between the cooling fin 41 on the plus side and the cooling fin 42 on the minus side.

The terminal block 52 serving as a terminal unit for the voltage regulator 3b is formed in the shape of a substantially square ring larger in the thickness than the terminal block 51, and provided with a lid 56 in a rectangular shape for covering the openings on the front side, and a cooling fan 48 for covering the openings on the rear side. A hybrid IC 47 is housed in the terminal block 52 filled up with silicon gel surrounding the hybrid IC 47. Also, the terminal block 52 is provided with two insertion holes 58 through which a fastening means (not shown) such as bolts or the like for securing the insulating member 45 and the cooling fan 48 to the rear cover 36 by tightening are inserted.

The connector 53 is a male connector, on which a female connector (not shown) is mounted, and provided with an insulation wall 59 therein for electrical insulation among a first input/output terminal 71, a second input/output terminal 72, and a third input/output terminal 73 stated hereafter through partition of the exposed parts of the aforementioned terminals.

The lead frame 46 is made of a sheet of an electrically conductive metal, for example, copper, aluminum, etc. and comprises a terminal unit stated hereafter and a frame 60 (refer to the double-dots-and-dash lines in FIG. 6) which will be detached from the terminal unit after formation. The terminal unit is provided with AC input terminals 61–64, the DC output terminal 65, an exciting current output terminal 66, an earthing terminal 67, dummy terminals 671 and 672, the first external input/output terminal 71, the second external input/output terminal 72, the third external input/output terminal 73, etc.

The AC input terminal 61 is a terminal unit (also referred to as a terminal for detecting generation of electric power or P terminal) to which the diode 43 on the plus side, the diode 44 on the minus side, the armature coils 33, and the hybrid IC 47 are electrically connected and large parts (except respective connections) of which are surrounded and sealed in by the terminal block 51.

Each of the AC input terminals 62–64 is a terminal unit to which the diode 43 on the plus side, the diode 44 on the minus side, and the armature coils 33 are electrically connected and large parts (except respective connections) of which are surrounded and sealed in with the terminal block 51.

The DC output terminal 65 is a terminal unit to which the terminal 31 of the brush 25, the cooling fin 41 on the plus side, the DC output terminal 40, and the hybrid IC 47 are electrically connected, and most parts (except respective connections) of which are surrounded and sealed in by the terminal block 51. The DC output terminal 65 is electrically connected to the terminal 31 by tightening with a fastening means 31a such as screws.

The exciting current output terminal 66 is a terminal unit (also referred to as F terminal) electrically connected to the terminal 30 of the brush 24 by tightening with a fastening means 30a such as screws and mostly (except the connection) surrounded and sealed in by the terminal block 52.

The earthing terminal 67 is a terminal unit (also referred to as E terminal) through which the voltage regulator 3b is body-earthed (grounded) to the rear cover 35 by tightening a fastening means such as screws and most parts (except the connection) of which are surrounded and sealed in by the terminal block 52. Also, the earthing terminal 67 is provided with two circular insertion holes 68 formed coaxially with the insertion holes 58 of the terminal block 52 for insertion of a fastening means such as bolts, etc. (not shown).

Figure 5:
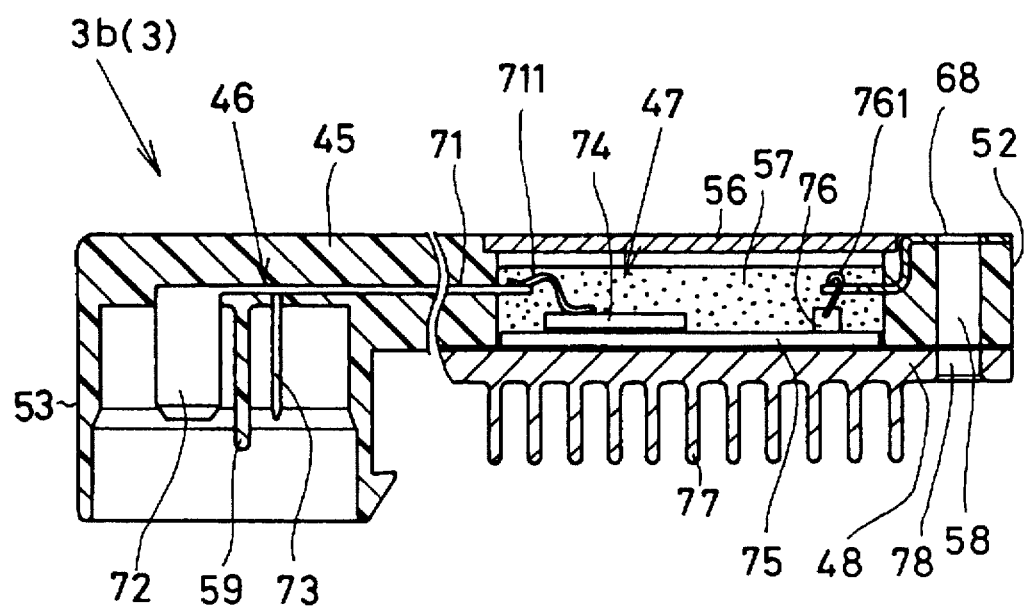
FIG. 5 is a sectional view showing the voltage regulator of FIG. 1.

The first external input/output terminal 71 is a terminal unit (also referred to as an external input terminal or IG terminal) which is electrically connected to the hybrid IC 47 on one end thereof and to an ignition switch (not shown) on the other end thereof via the female connector and a lead wire (not shown) and large parts (except respective connections) of which are surrounded and sealed in with the terminal block 52 and the connector 53. As shown in FIG. 5, the first external input/output terminal 71 is electrically connected to a semiconductor device 74 of the hybrid IC 47 by a wire boding 711. Referring to FIGS. 1, 2, 5, and 6, the second external input/output terminal 72 is explained. The second external input/output terminal 72 is a terminal unit (also referred to as a charge-lamp-off terminal, external output terminal or L terminal) which is electrically connected to the hybrid IC 47 on one end thereof and to a charge lamp (not shown) on the other end thereof via the female connector and a lead wire (not shown) and large parts (except respective connections) of which are surrounded and sealed in by the terminal block 52 and the connector 53.

The third external input/output terminal 73 is a terminal unit (also referred to as a battery voltage input terminal, external input terminal, or S terminal), functioning as a regulator sensor for detecting a battery voltage, which is electrically connected to the hybrid IC 47 on one end thereof and to the positive terminal (not shown) of the battery on the other end thereof via the female connector and a lead wire (not shown) and large parts (except respective connections) of which are surrounded and sealed in by the terminal block 52 and the connector 53.

The hybrid IC 47 is also called a IC regulator which is the semiconductor device (integrated circuit) 74 mounted on, for example, a ceramic substrate 75 (also referred to as an island). Semiconductor devices other than the semiconductor device 74 such as a power transistor (transistor for exciting current), a diode for absorption of counter-electromotive force, a transistor for charge lamp on/off, etc. and a number of electrical parts such as resistance, etc. are mounted on the ceramic substrate 75. As shown in FIG. 5, a terminal (an L pad) 76 on the ceramic substrate 75 is electrically connected to the earthing terminal 67 by a wire bonding 761.

The cooling fin 48 is provided with a plurality of tooth-like fins 77 functioning as radiation fins for sending out heat generated by the hybrid IC 47. Also, the cooling fin 48 is provided with two circular insertion holes 78, formed coaxially with the insertion holes 58 of the terminal block 52 and the insertion holes 68 of the earthing terminal 67, into which fastening means (not shown) such as bolts are inserted.

Figure 6:
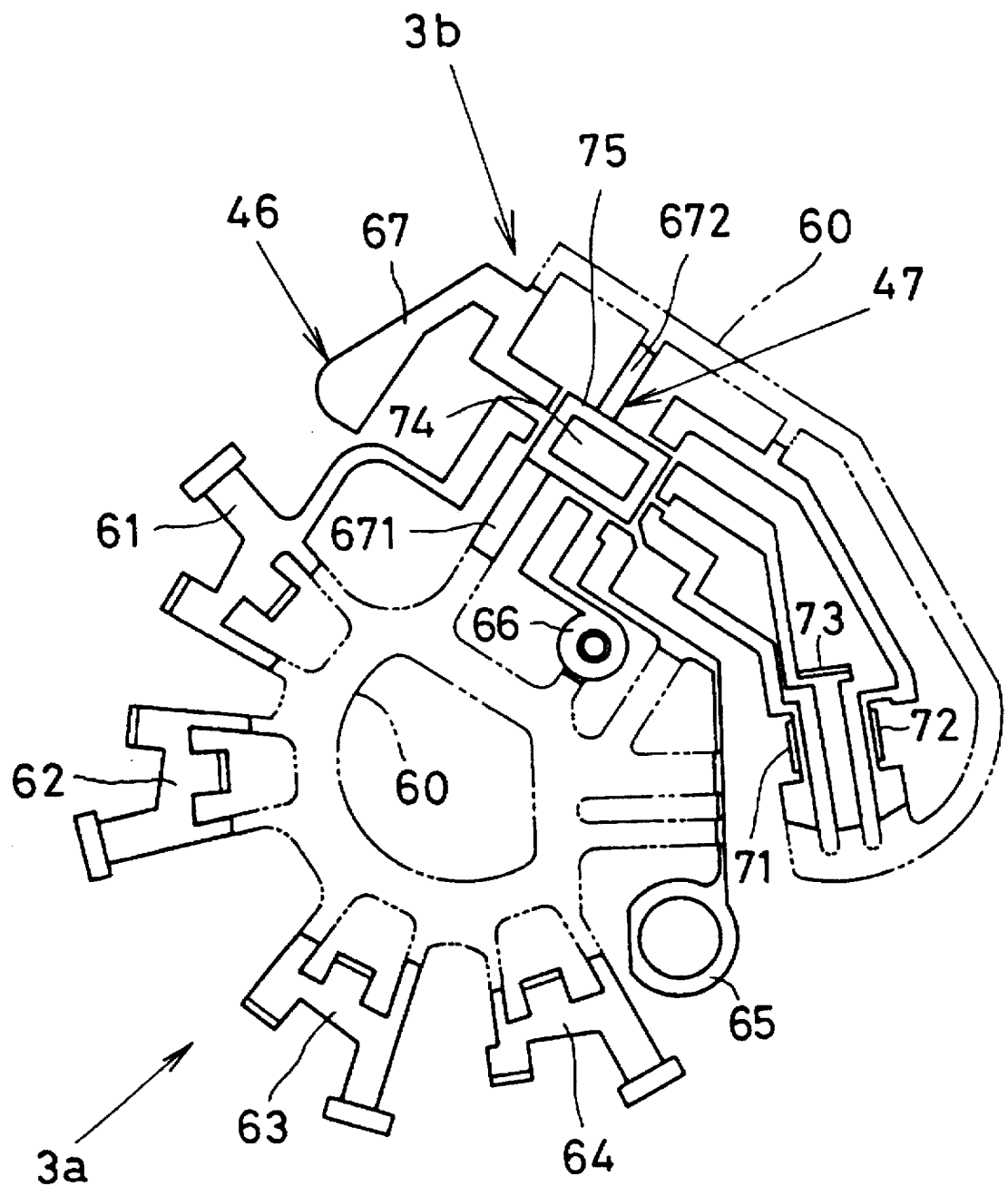
FIG. 6 is a plan view showing a lead frame.

Now referring to FIGS. 2 and 6, the method of manufacturing the insulating member 45 and the lead frame 46 of the alternator 1 for vehicle in the first embodiment is briefly explained.

1) Process of Forming the Lead Frame 46

The lead frame 46 including the terminal units and the frame 60 (shown in FIG. 6) is formed by first forming an electrically conductive metal (for example, copper, aluminum, etc.) into a thin sheet using an etching method or the like according to the pattern shown in FIG. 6. The terminal unit includes the AC input terminals 61–64, the DC output terminal 65, the exciting current output terminal 66, the earthing terminal 67, dummy terminals 671 and 672, the first to third external input/output terminals 71–73, etc.

2) Process of Insert-molding a Part of the Lead Frame 46 in the Insulating Member 45

After inserting a part of the lead frame 46 stated above into a resin mold, electrically conductive resin (for example, PPS resin, etc.) in fusion state is poured into the resin mold, and a molded product is taken out after cooled down. (that is, sealing the terminal unit, the connecting member, and molding the terminal unit); whereupon the insulating member 45 is formed integrally with the terminal block 51 of the rectifier 3a, the terminal block 52 of the voltage regulator 3b, and the connector 53 while the AC input terminals 61–64, the DC output terminal 65, the exciting current output terminal 66, the earthing terminal 67, the dummy terminals 671 and 672, and the first to third external input/output terminals 71–73 are sealed by the insulating member 45.

3) Process of Separating the Frame 60 of the Lead Frame 46

Then, the frame 60 is separated from the terminal unit by a punching process after the insulating member 45 and the lead frame 46 are taken out of the resin mold, producing a molded insulating resin body 50 formed in a substantially annular sheet shape with the terminal unit insert-molded. (that is, punch-pressing the terminal unit and the connecting member)

Referring to FIGS. 1 and 6, the operation of the alternator 1 in this embodiment is briefly explained.

The engine mounted in a vehicle is started by activation of an engine starter when electric power is supplied to the engine starter from a battery by turning an ignition switch ON. When the engine is thus driven, the rotational power of the engine is conveyed to the V ribbed pulley 14 via a transmission means such as the multi-V belt, etc., and the shaft 7 rotatably supported by the drive frame 34 and the rear frame 35 by means of the front bearing 12 and the rear bearing 13 is rotated, causing the rotor 4 to be rotated; whereupon, the pole core 8, the field coil 9, and the two slip rings 10 and 11, which are integral with the shaft 7, are rotated.

When the ignition switch is turned ON, the power transistor (not shown) of the hybrid IC 47 is kept in a continuous ON state, allowing exciting current to flow from the battery—the DC output terminal 65—the terminal 31—the brush 24—the slip ring 10—the shaft connection bar 22—the field coil 9—the shaft connection bar 23—the slip ring 11—the brush 25—the terminal 30—the exciting current terminal 66—the power transistor of the hybrid IC 47—the earthing terminal 67—the rear cover—finally to the body.

Exciting current flowing through the field coil 9 on which a voltage is impressed by the battery causes a pair of claw magnetic pole shoes 16 and 17 of the pole core 8 to be excited, turning all of the claw magnetic pole shoes 16 on one side into the north magnetic pole and the same 17 on the other side the south magnetic pole.

Consequently, alternating current is induced in sequence in the three-phase armature coils 33 wound around the armature core of the stator 5 rotating relative to the rotor 4, raising rapidly a voltage of generated power; the three-phase AC is inputted into the rectifier 3a via the AC input terminals 61–64, that is, the three-phase AC inputted into the four diodes 43 on the plus side and the four diodes 44 on the minus side is rectified and converted into direct current.

When the voltage of generated power (voltage at the DC output terminal 40 or voltage at B terminal) originated from the three-phase armature coils 33 exceeds the voltage of the battery, rectified DC, namely, charging current is supplied to the battery via the four diodes 43 on the plus side—the cooling fin 41 on the plus side—the DC output terminal 40; the battery is thus charged by the charging current flowing therein.

When the power transistor of the hybrid IC 47 remains in OFF state continuously, the voltage at the DC output terminal 40 (B terminal voltage) will rise depending on variation in the engine speed. When the voltage at the third external input/output terminal 73 (S terminal voltage) for detecting the battery voltage exceeds the battery regulating voltage (about 14.5 V at 25° C. of atmospheric temperature), this is then detected by the semiconductor device 74 of the hybrid IC 47 mounted on the ceramic substrate 75, turning the power transistor OFF.

Subsequently, the exciting current in the field coil 9 is caused to flow through a diode for absorption of counter-electromotive force of the hybrid IC 47 as follows; from the field coil 9—the shaft connection bar 23—the slip ring 11—the brush 25—the terminal 30—the exciting current output terminal 66—the diode for absorption of counter-electromotive force—the DC output terminal 65—the terminal 31—the brush 24—the slip ring 10—the shaft connection bar 22—the field coil 9.

As a result, the exciting current flowing in the field coil 9 is attenuated and the voltage of power induced in the three-phase armature coils 33 is reduced, resulting in a reduction of the DC output voltage after rectification of AC through the four diodes 43 on the plus side and the four diodes 44 on the minus side, that is, the voltage at the DC output terminal 40 (B terminal voltage).

Then, when the voltage at the third external input/output terminal 73 (S terminal voltage) drops below the battery regulating voltage, this is detected by the semiconductor device 74 of the hybrid IC 47, turning the power transistor ON. Subsequently, the exciting current flowing in the field coil 9 is increased and the voltage of power induced in the three-phased armature coils 33 is increased, resulting in an increase of the DC output voltage after rectification of the AC voltage, through the four diodes 43 on the plus side and the four diodes 44 on the minus side, that is, the voltage at the DC output terminal 40 (B terminal voltage); the repetition of the operation stated as above enables the voltage regulator 3b to control the voltage at the third external input/output terminal 73 (S terminal voltage) at a constant value (the battery regulating voltage).

The rotor 4, the stator 5, and respective electrical parts of both the rectifier 3a and the voltage regulator 3b of the alternator 1 for vehicle will generate heat when energized but the aforesaid components are cooled since such heat is radiated by cool air sucked into the housing 6 by the rotation of the cooling fans 18 and 19 fitted to a pair of the claw magnetic poles 16 and 17, respectively, when the pole core 8 is rotated.

More specifically, the exciting coils 9 of the rotor 4 and the three-phase armature coils 33 of the stator 5 are directly cooled by cool air blown in by the cooling fans 18 and 19 through a plurality of ventilation slots 341 and 351 of the drive frame 34 and the rear frame 35, respectively, and a plurality of ventilation slots of the rear cover 36 as shown in FIG. 3.

As shown in FIGS. 1, 3, and 4, heat generated in the four diodes 43 on the plus side and the four diodes 44 on the minus side is radiated via the cooling fin 41 on the plus side and the cooling fin 42 on the minus side by cool air blown in through a plurality of ventilation slots of the rear cover 36, striking at and cooling down the cooling fin 41 on the plus side and the cooling fin 42 on the minus side.

As shown in FIGS. 1, and 5, heat generated in the hybrid IC 47 of the voltage regulator is radiated via the cooling fan 48 being cooled by cool air, blown in through a plurality of ventilation slots of the rear cover 36, striking at and cooling down a plurality of tooth-like fins 77 of the cooling fan 48.

As stated above, in the alternator 1 for vehicle according to this embodiment, the AC input terminal 61 and the DC output terminal 65 are formed integrally from one electrically conductive metal material although conventionally the rectifier 3a and the voltage regulator 3b had respective terminal units, separate from each other, which needed to be electrically connected by tightening with a fastening means such as screws, etc.

Accordingly, in this embodiment, the rectifier 3a can be electrically connected to the voltage regulator 3b without mechanically fastening them together and large part of the electrically conductive connecting sections between the rectifier 3a and the voltage regulator 3b, which used to be exposed conventionally, namely, large part of both the AC input terminal 61 and the DC output terminal 65, are covered and sealed in with electrically insulating resin (for example, PPS resin, etc.). As a result, the exposed area of the connecting sections between the rectifier 3a and the voltage regulator 3b is reduced, improving the environmental resistibility of the connecting sections although the rectifier 3a and the voltage regulator 3b are under such a severe environmental condition as is high in both temperature and moisture and furthermore subject to a risk of being splashed with water as the case may be.

This eliminates the necessity of spacing widely between the connecting sections of the rectifier 3a and the voltage regulator 3b and other electrically conductive members such as the cooling fin 41 on the plus side and the cooling fin 42 on the minus side, etc. enabling the dimensions of the connecting sections between the rectifier 3a and the voltage regulator 3b to be reduced and leading to miniaturization in the overall construction of the alternator 1 for vehicle. As a result, no insulating means such as extra painting or the like is required, also contributing to a reduction in the production cost.

Due to the improved environmental resistibility and miniaturization of the connecting sections at the AC input terminal 61 and the DC output terminal 65 between the rectifier 3a and the voltage regulator 3b, the both ends of the cooling fin 42 on the minus side, electrically charged parts, can be extended in close proximity to the AC input terminal 61 and the DC output terminal 65.

Therefore, unused space in the vicinity of the AC input terminal and the DC output terminal can be made better use of for improving the cooling efficiency of the four diodes 43 on the plus side and the four diodes 44 on the minus side. Thus, the installation space in a small engine room for the alternator 1 for vehicle can be reduced as a result of the miniaturization of the alternator 1 and a space vacated thereby can be utilized.

The use of a single integral member for both the AC input terminal 61 and the DC output terminal 65 in place of two or more members joined together by, for example, welding, etc. for use as the AC input terminal 61 and the DC output terminal 65 results in reduction of the number of components used and the steps of an assembling process, contributing to an improvement in the productivity of the alternator 1 for vehicle, and also a reduction in the production cost.

The terminal block 51 of the rectifier 3a, the terminal block 52 of the voltage regulator 3b, and the connector 53 are integrally formed by a resin of the same electrically insulating characteristic (for example, PPS, etc.); in other words, the terminal block 51 of the rectifier 3a, the terminal block 52 of the voltage regulator 3b, and the connector, which used to be separated from each other conventionally, can be formed in a single resin mold at one time.

The terminal unit including the AC input terminals 61–64, the DC output terminal 65, the exciting current output terminal 66, the earthing terminal 67, the dummy terminals 671 and 672, the first external input/output terminal 71, the second external input/output terminal 72, the third external input/output terminal 73, etc. is formed by separating the frame 60 from one component (the lead frame 46). Therefore, the number of components used can be reduced drastically and in a sealing process for sealing one part of the lead frame 46 with the insulating member 45, it is sufficient to secure provisionally just one of a plurality of the terminals to a resin mold, etc., resulting in a large improvement in the productivity.

Consequently, the number of resin molds and terminal components can be reduced and both a process for forming electrically insulating resin and a process for assembling the rectifier 3a with the voltage regulator 3b are largely simplified, contributing to a remarkable improvement of the productivity.

Since the production cost of the alternator 1 for vehicle can be further reduced as above, the cost of a vehicle provided with the alternator 1 available at such a very low cost can be reduced.

Second Embodiment

Figure 7:
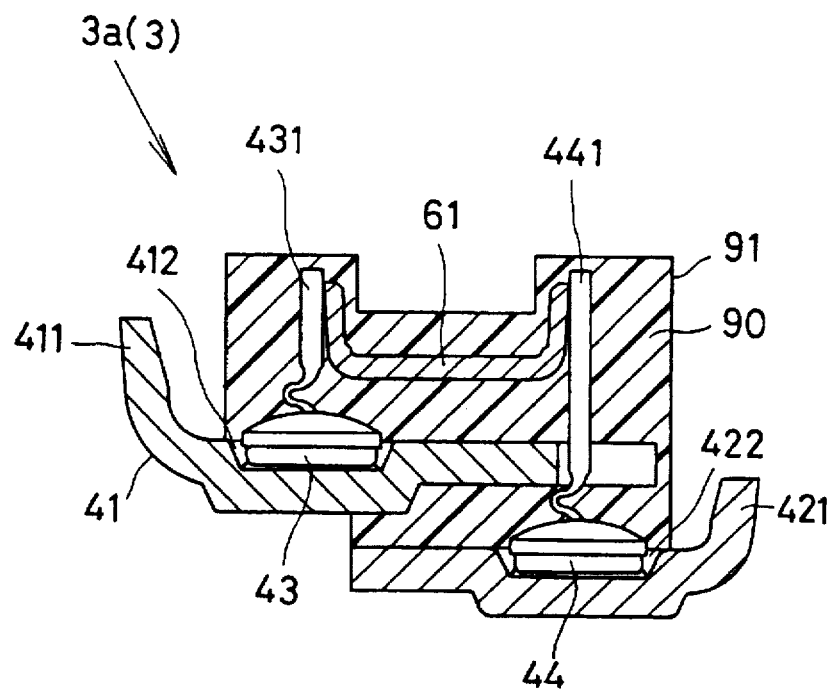
FIG. 7 is a sectional view of a rectifier of an alternator for vehicle according to a second embodiment of the present invention.

FIG. 7 illustrates the rectifier of an alternator for vehicle in a second embodiment of the present invention.

In this embodiment, an insulating member 90 (a holding member and a sealing member) for insulating the AC input terminals 61–64, the DC output terminal 65, and part of the first to third external input/output terminals 71–73 are used to seal in the semiconductor devices (the four diodes 43 on the plus side and the four diodes 44 on the minus side) of the rectifier 3a as well; in other words, as shown in FIG. 7, not only the AC input terminals 61–64 and the DC output terminal 65 but also the four diodes 43 on the plus side and the four diodes 44 on the minus side are sealed in with a terminal block 91 made from the insulating member 90.

Referring to FIGS. 6 and 7, the method of manufacturing the insulating member 90 and the lead frame 46 of the alternator 1 for vehicle in this embodiment is briefly explained.

1) Process of Forming the Lead Frame 46

Firstly, the lead frame 46 having the terminal unit in a predetermined shape and the frame 60 as shown in FIG. 6 is formed from an electrically conductive metal (for example, copper, aluminum, etc.) (Lead Frame Forming Process)

2) Process of Connecting the Lead Frame 46, Semiconductor Devices of the Rectifier 3a, the Cooling Fin 41 on the plus side, and the Cooling Fin 42 on the minus side Secondly, four diodes 43 on the plus side and four diodes 44 on the minus side are provisionally secured to the recess 412 of the cooling fin 41 on the plus side and the recess 422 of the cooling fin 42 on the minus side, respectively, by means of soldering or the like (process of connecting the terminal block to the semiconductor devices of the rectifier 3a and process of connecting the connecting member to the semiconductor devices). It is desirable to secure provisionally other accessory components of the cooling fin 41 on the plus side and the cooling fin 42 on the minus side.

3) Process of Insert-molding part of the Lead frame 46 and the Semiconductor Devices of the Rectifier 3a in the Insulating Member 90

Thirdly, after inserting the insert part as stated above of the lead frame 46, the cooling fin 41 on the plus side, the cooling fin 42 on the minus side, the four diodes 43 on the plus side, and the four diodes 44 on the minus side into a resin mold, an electrically conductive resin (for example, epoxy resin with high adhesiveness) in fusion state is injected into the resin mold and after cooled down, a molded resin is taken out (sealing process of the terminal unit and the connecting member, and molding process of the terminal block); whereupon, the terminal block 91 of the rectifier 3a, the terminal block 52 of the voltage regulator 3b and the connector 53 are integrally formed from the insulating member 90 and inside the terminal block 91, the cooling fin 41 on the plus side, the cooling fin 42 on the minus side, the four diodes 43 on the plus side, and the four diodes 44 on the minus side are sealed.

4) Process of Separating the Frame 60 of the Lead Frame

Finally, in the same way as in the case of the first embodiment, the insulating member 90 and the lead frame 46 are taken out of the resin mold, and then the frame 60 is separated from the terminal unit by a punch-pressing operation (process of punch-pressing the terminal unit and the connecting members).

In this embodiment for the alternator 1 for vehicle as described above, it is possible to carry out two processes simultaneously; a sealing process for sealing the terminal unit comprising the AC input terminals 61–64, the DC output terminal 65, etc. and the four diodes 43 on the plus side and the four diodes 44 on the minus side of the rectifier 3a by the insulating member 90, and a forming process for forming at least the terminal block 91, the terminal block 52 and the connector 53. As a result, drastic improvement in the productivity is achieved, contributing further to a reduction in the production cost of the alternator 1 for vehicle.

Third Embodiment

Figure 8:
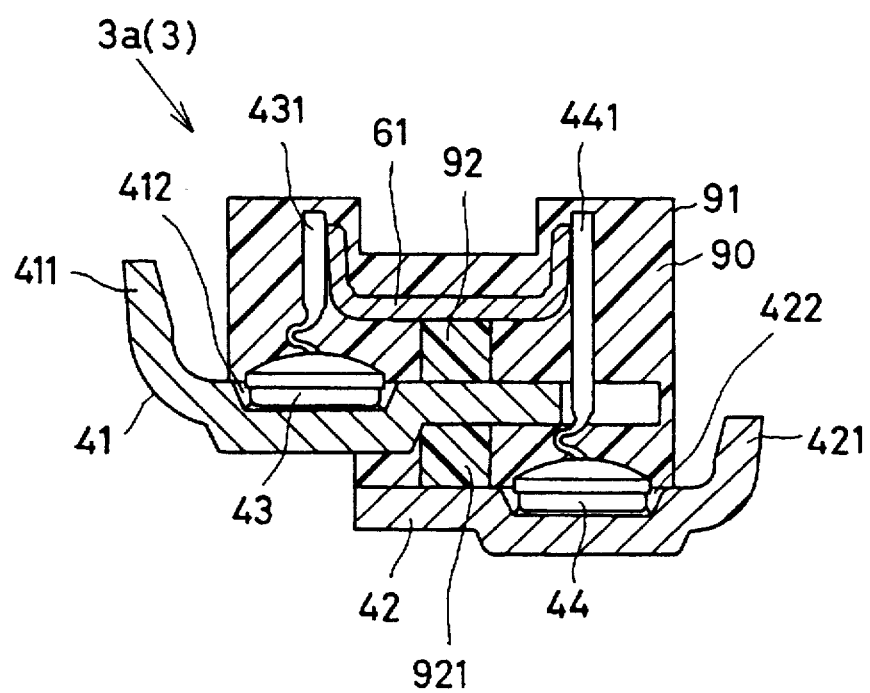
FIG. 8 is a sectional view of a rectifier of an alternator for vehicle according to a third embodiment of the present invention.

FIG. 8 illustrates a third embodiment of the invention showing a rectifier of an alternator for vehicle.

In this embodiment, four diodes 43 on the plus side and four diodes 44 on the minus side of a rectifier 3a are sealed in by an insulating member 90 for sealing AC input terminals 61–64, a DC output terminal 65, and the first to third external input/output terminals 71–73; in other words, as shown in FIG. 8, not only the AC input terminals 61–64 and the DC output terminal 65 but also the four diodes 43 on the plus side and the four diodes 44 on the minus side are sealed in with a terminal block 91 made from the insulating member 90 integrally formed by an electrically insulating resin (for example, epoxy resin, etc. having high adhesion).

Further, in this embodiment, before executing a molding process of a semiconductor device and the terminal block 91, a cooling fin 41 on the plus side and a cooling fin 42 on the minus side are provisionally secured by an insulating wall 921 of an insulating member 90 made from an electrically insulating resin (for example, PPS resin having high strength and high dimensional stability), different from the same of the insulating member 90.

Therefore, in sealing the four diodes 43 on the plus side and the four diodes 44 on the minus side of the rectifier 3a by covering the same with the insulating member 90, it is desirable to use the insulating member 92 having a higher dimensional stability than that of the insulating member 90, as in this embodiment, for a resin section forming an insulating wall (provisional mount) 921, in the shape of a cylinder or a square cylinder, between the cooling fin 41 on the plus side and the cooling fin 42 on the minus side, which need to be kept apart at a predetermined spacing. The insulating wall 921 is a projection formed in the shape of a cylinder or a square cylinder for provisionally securing the cooling fin 42 on the minus side to the cooling fin 41 on the plus side and may be formed integrally with or separately from the insulating member 90 disposed over the top thereof. The insulating wall 921 also functions as an insulation distance holding means for maintaining a predetermined insulating spacing between the cooling fin 41 on the plus side and the cooling fin 42 on the minus side Fourth Embodiment FIG. 9 illustrates a fourth embodiment of the preferred embodiments of the invention showing a voltage regulator of an alternator for vehicle.

Figure 9:
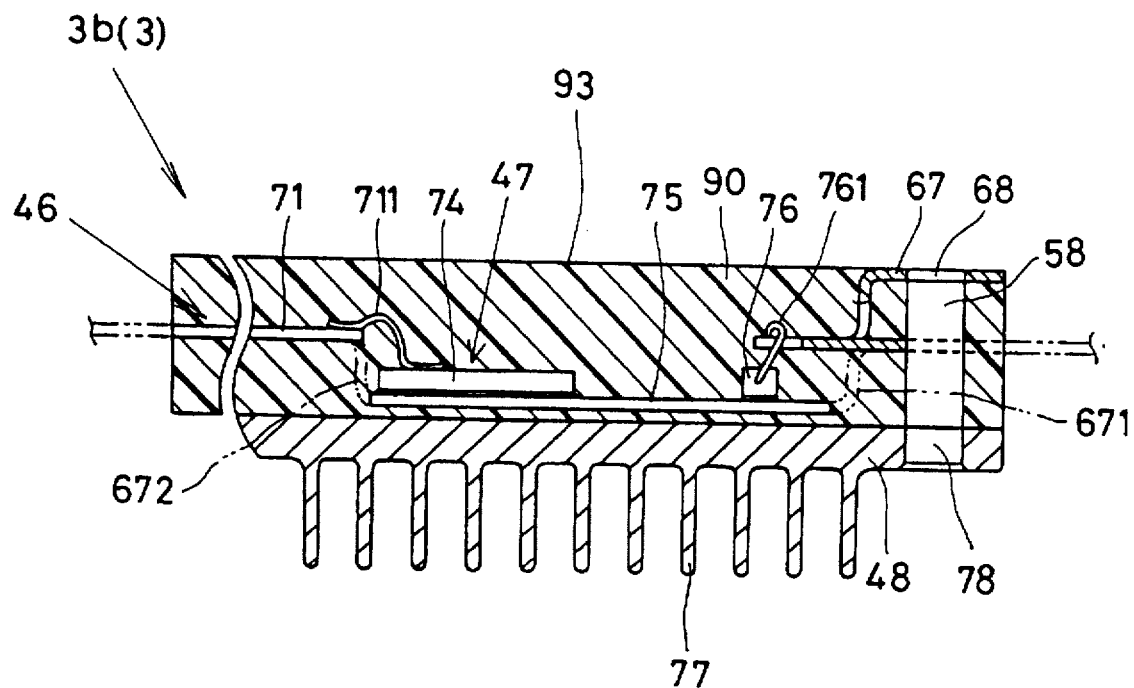
FIG. 9 is a sectional view of a voltage regulator of an alternator for vehicle according to a fourth embodiment of the present invention.

In a hybrid IC 47 of this embodiment, a semiconductor device (integrated circuit) 74 mounted on, for example, a ceramic substrate 75 and a terminal 76 are electrically connected to a lead frame by wire bonding; in FIG. 9, the semiconductor device 74 is electrically connected to a first external input/output terminal 71 by a wire bonding 711, and the terminal 76 to an earthing terminal 67 by a wire bonding 761.

Furthermore, four diodes 43 on the plus side and four diodes 44 on the minus side of a rectifier 3a, the semiconductor device 74 and a part of the lead frame 46 of a voltage regulator 3b, cooling fins 41 and 42 on the plus side and the minus side, respectively, of the rectifier 3a, and the ceramic substrate 75 side of a cooling fin section 48 of the voltage regulator 3b are covered and sealed in with an insulating member 90 made from an electrically insulating resin (for example, epoxy resin or the like having high adhesiveness). The insulating member 90 forms a terminal block 91 as shown in the second embodiment (refer to FIG. 7) and also a shield case 93 of the voltage regulator 3b as shown in FIG. 9.

Fifth Embodiment

Figure 10:
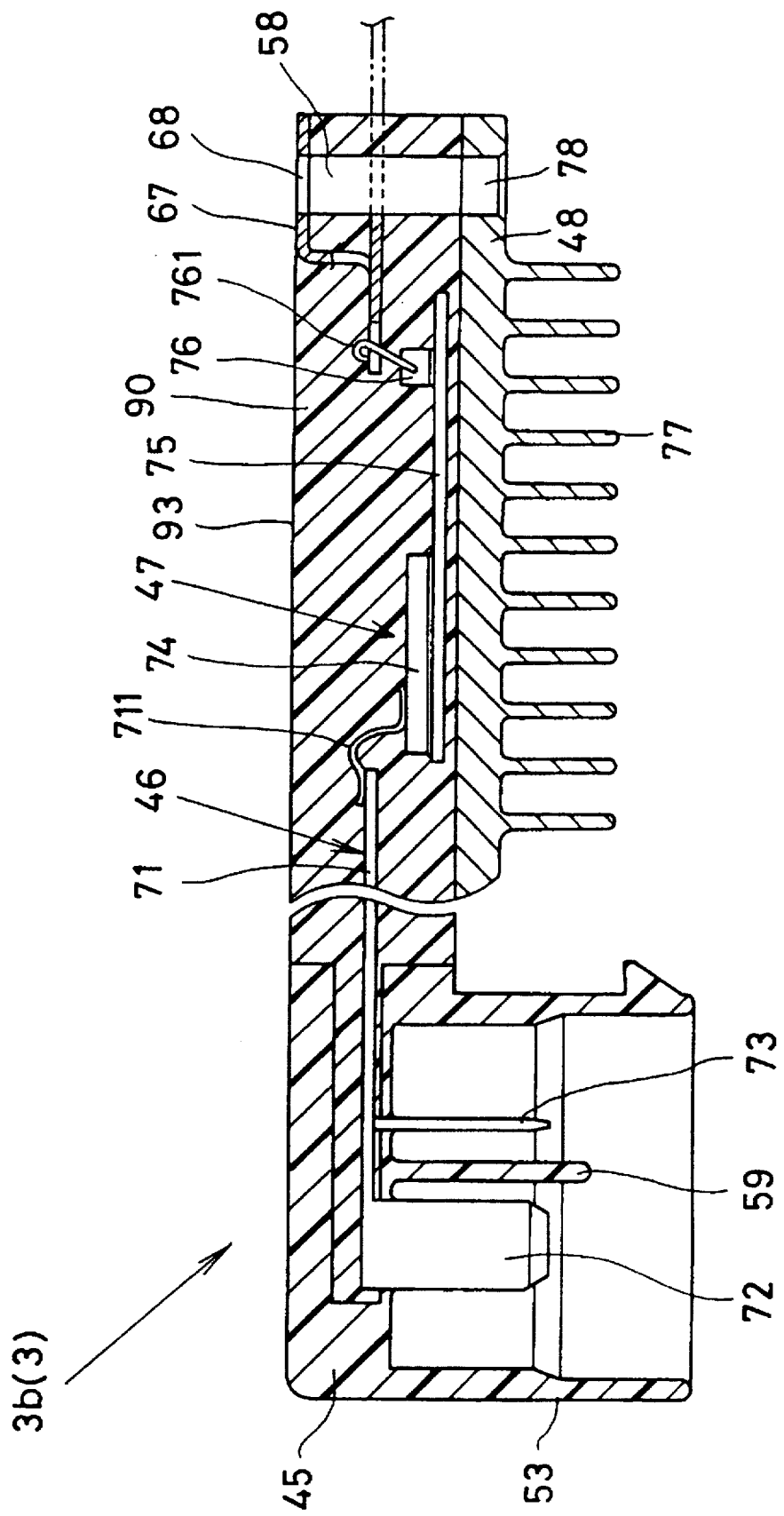
FIG. 10 is a sectional view of a voltage regulator of an alternator for vehicle according to a fifth embodiment of the present invention.

FIG. 10 illustrates a fifth embodiment of the preferred embodiments of the invention showing a voltage regulator of an alternator for vehicle.

A voltage regulator 3b in this embodiment comprises a lead frame 46, a shield case 93, a connector (connector house) 53, a hybrid IC 47, a cooling fan 48, etc. The shield case 93 is formed integrally with a terminal block 91 of a rectifier 3a by an insulating member 90 made of an electrically insulating resin (for example, epoxy resin or the like as a first material). The connector 53 is formed in a predetermined shape by an insulating member 45 made of another electrically insulating resin (for example, PPS resin or the like as a second material); the connector 53 of the same construction as shown in the first embodiment is provided with an insulating wall 59 for partitioning and insulating the exposed parts of the first to third external input/output terminals 71–73; the exposed parts being surrounded by the insulating wall 59.

In this embodiment, the rectifier 3a and the voltage regulator 3b which have high strength, high dimensional precision, and also excellent environmental resistibility precluding the risk of electrolytic corrosion resulting from some parts being splashed with water are provided by using the insulating member 90 of highly adhesive resin, for example, epoxy resin or the like for the terminal block 91 and the shield case 93, and using the insulating member 45 of a resin having high strength, and high dimensional precision, for example, PPS resin or the like for the connector 53.

Sixth Embodiment

Figure 11:
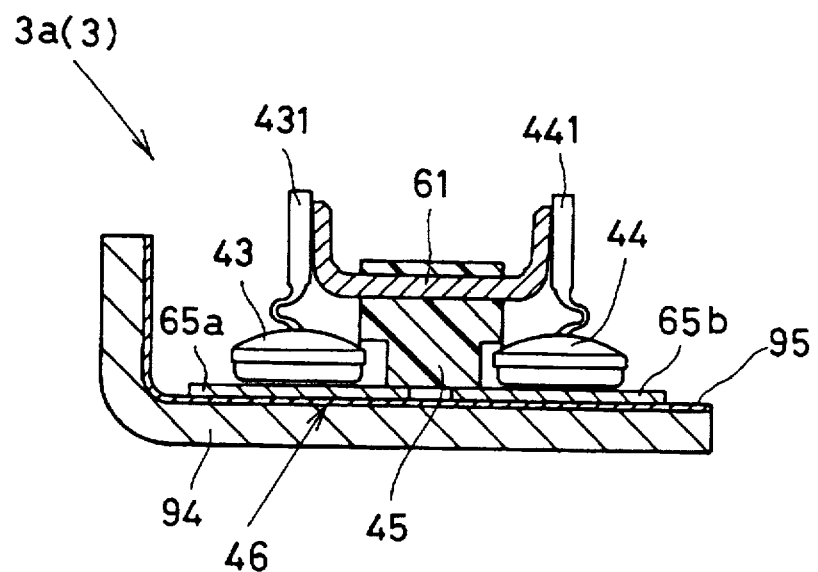
FIG. 11 is a sectional view of a rectifier of an alternator for vehicle according to a sixth embodiment of the present invention.

FIG. 11 illustrates a sixth embodiment of the preferred embodiments of the invention showing a rectifier of an alternator for a vehicle.

In this embodiment, four diodes 43 on the plus side and four diodes 44 on the minus side of a rectifier 3a are mounted on a single cooling fin 94; the cooling fin 94 is made by press forming a sheet of metal, for example, aluminum, etc. into a predetermined shape and body-earthed (grounded). With a lead frame 46, at least a DC output terminal 65a on the plus side and a DC output terminal 65b on the minus side are formed on the cooling fin 94 with an insulating member 95 interposed therebetween beforehand. The insulating member 95 is made of an electrically insulating resin (for example, PPS resin or epoxy resin or the like) and formed into a thin sheet disposed along the surface on one side of the cooling fin 94. An AC input terminal (not shown) may be formed on the cooling fin 94 with the insulating member 95 interposed therebetween beforehand.

Seventh Embodiment

Figure 12:
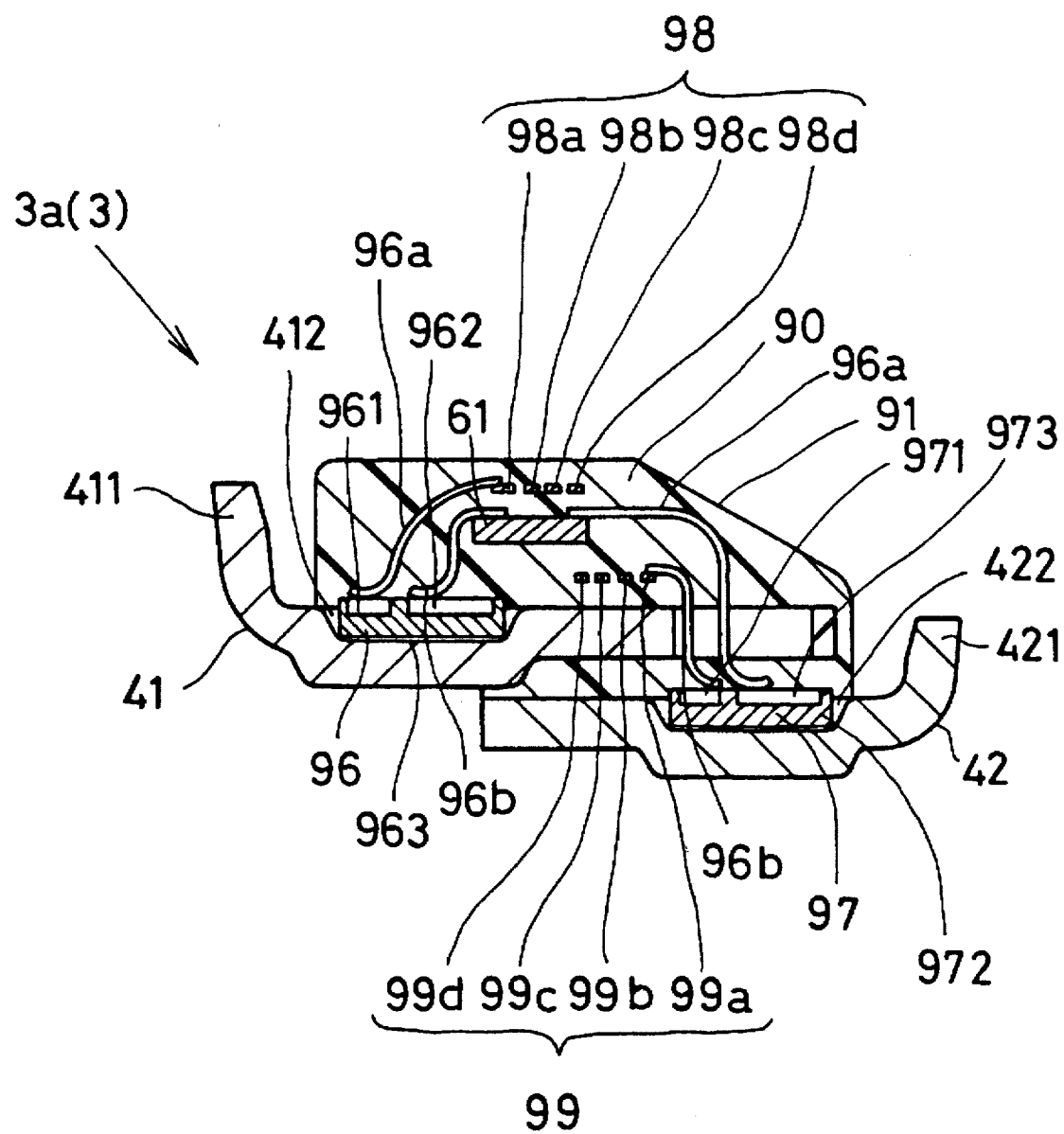
FIG. 12 is a sectional view of a rectifier of an alternator for vehicle according to a seventh first embodiment of the present invention.
Figure 13:
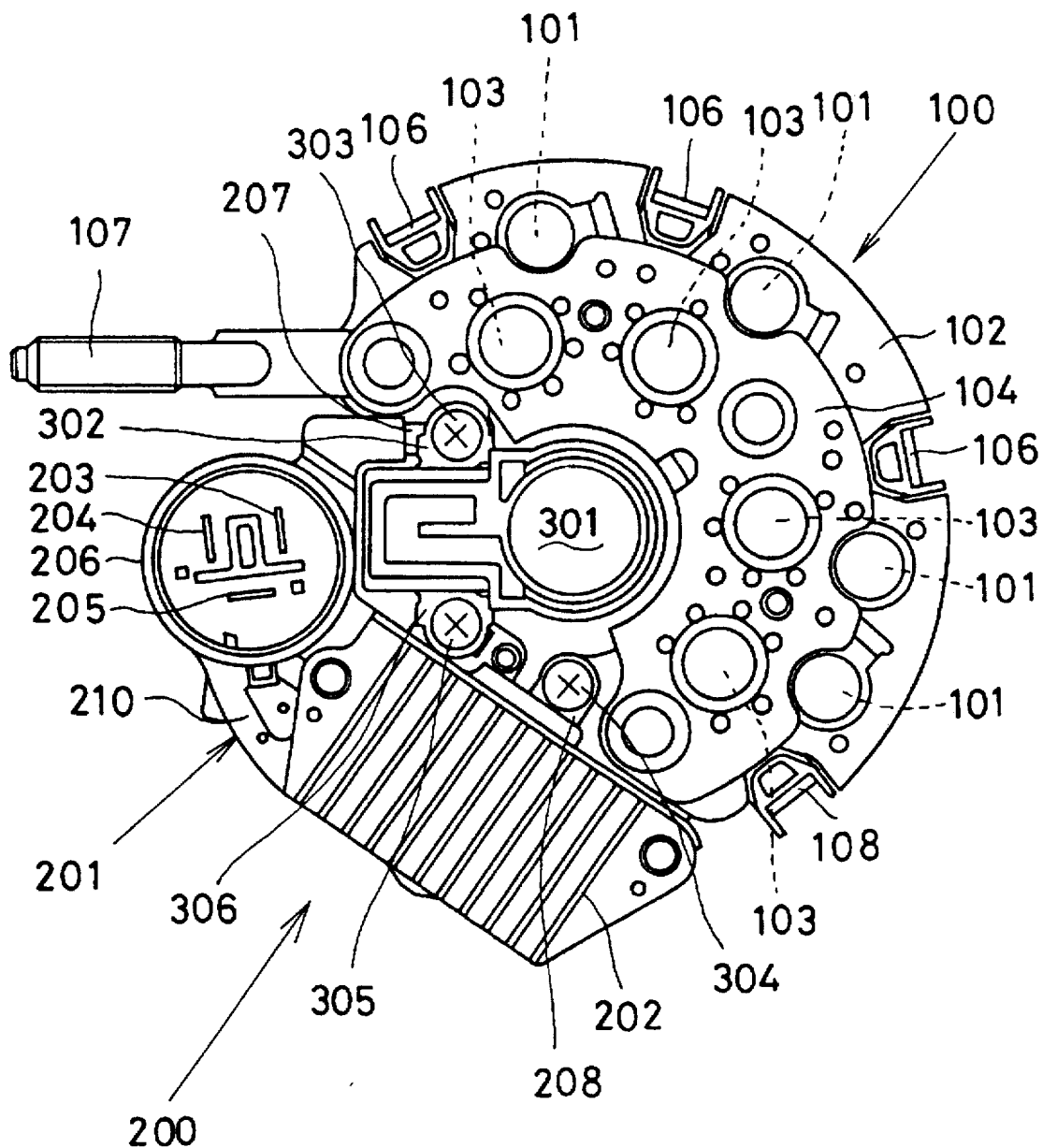
FIG. 13 is a plan view showing the conventional rectifying and voltage regulating unit of an alternator for vehicle.
Figure 14:
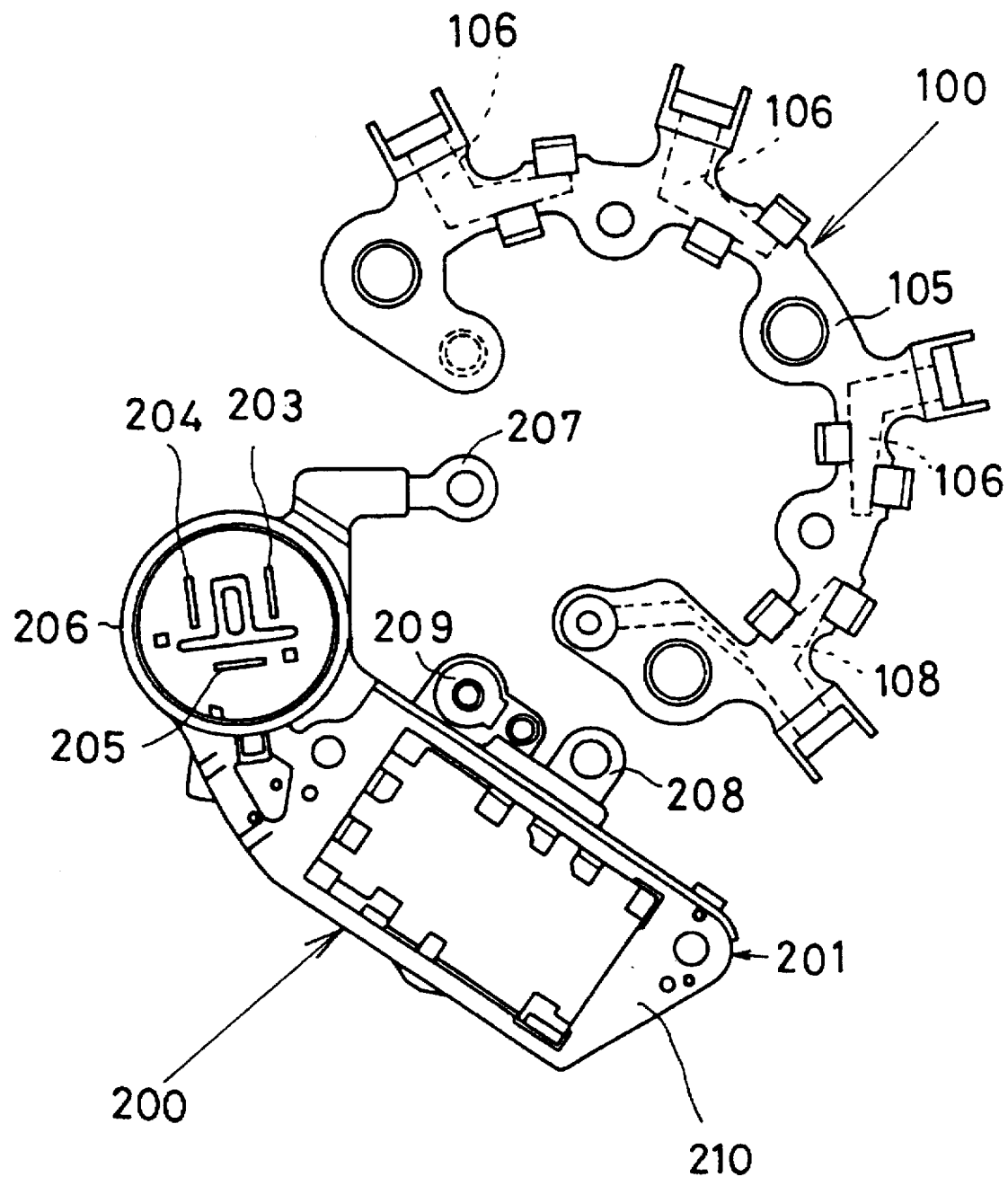
FIG. 14 is an exploded view showing the insulating members of the conventional rectifier and voltage regulator of an alternator for vehicle.

FIG. 12 illustrates a seventh embodiment of the preferred embodiments of the invention showing a rectifier of an alternator for vehicle.

In this embodiment, SiC-MOSFETs (SiC-MOS type field effect transistor) on the plus side 96 and the minus side 97, respectively, each provided with a semiconductor made of silicon carbide and a surface insulator made of heat-formed silicon oxide, are in use and sealed in with a terminal block 91 formed by an insulating member 90 made of an electrically insulating resin (for example, epoxy resin or the like as a first molding material) for sealing in an AC input terminal 61 and a DC output terminal 65; gate electrodes, 961 and 971, source electrodes, 962 and 972, and drain electrodes, 963 and 973, are provided on the surface of SiC-MOSFETs, 96 and 97, respectively.

The SiC-MOSFET 96 on the plus side is mounted on a cooling fin on the plus side, is turned ON and OFF, and functions as a semiconductor switching element on the plus side of a rectifier 3a for rectifying electric current. The gate electrode 961 is electrically connected via a wire bonding 96a to a transmission wire 98a of a transmission wire group 98, through which gate signals are transmitted from the IC of a voltage regulator 3b.

The source electrode 962 is electrically connected to the input terminal 61 via a wire bonding 96b and the drain electrode 963 is electrically connected to the inside of a recess 412 of a cooling fin 41 on the plus side by means of soldering or the like.

The transmission wire group 98 has a plurality of transmission wires 98b–98d, through which the gate signals are transmitted from the gate electrodes of three other SiC-MOSFETs (not shown) on the plus side except the SiC-MOSFET 96 on the plus side.

The SiC-MOSFET 97 on the minus side is mounted on a cooling fin 42 on the minus side, is turned ON and OFF, and functions as a semiconductor switching element on the minus side of the rectifier 3a for rectifying electric current. The gate electrode is electrically connected via a boding wire 97a to a transmission wire 99a of a transmission wire group 99, through which the gate signals are transmitted from the IC of the voltage regulator 3b. The source electrode 972 is electrically connected to the inside of a recess 422 of the cooling fin 42 on the minus side by means of soldering or the like and the drain electrode 973 is electrically connected to the AC input terminal 61 via a wire bonding 97b. The transmission wire group 99 has a plurality of transmission wires 99b–99d, through which the gate signals are transmitted from the gate electrodes of three other SiC-MOSFETs (not shown) on the minus side except the SiC-MOSFET 97 on the minus side.

One of the advantages of this embodiment is that since the SiC-MOSFETs on the plus side and the minus side 96 and 97 are utilized as the rectifying devices on the plus side and the minus side, respectively, of the rectifier 3a, the ON timing can be controlled, enabling the rectifier 3a to control the output. But, the use of SiC-MOSFETs on the plus side and the minus side 96 and 97, respectively, entails requirement of one AC input terminal 61 (or one DC output terminal) as a connecting member for electrically connecting the rectifier 3a to the voltage regulator 3b for every one rectifying device, resulting in an increase in the steps of a connecting process for connecting sections between the rectifier 3a and the voltage regulator 3b and also an unavoidable increase in the size of the connecting sections.

Therefore, simplification of the connecting sections between the rectifier 3a and the voltage regulator 3b can bring about remarkable effects in respect of productivity improvement and miniaturization. In addition, due to less resistance during on time of SiC-MOSFETs on the plus side and the minus side 96 and 97, the rectifying devices on both the plus side and the minus side generate much less heat than the diodes of the conventional type.

Accordingly, not only electrically charged parts but also the cooling fins themselves, namely, 41 on the plus side and 42 the minus side, can be reduced in size and the required strength of the terminal block 91 becomes lower, contributing to a large reduction in the consumption of resin (for example, epoxy, etc.).

Consequently, a reduction in the size of the overall construction of the alternator 1 for vehicle can be realized and greater flexibility in the choice of resin as suitable forming material is obtained because there will be no need of being concerned with the shorter life of a fitting member for the rectifying device, for example, a solder metal due to its thermal fatigue and also taking into consideration the heat resistance and the radiation characteristic of the insulating member 90, in which the rectifying devices on the plus side and the minus side are sealed. In place of SiC-MOSFET, other semiconductor switching elements such as Si-MOSFET, bipolar transistor, etc. may be used.

In the foregoing embodiments, the invention is applied to the alternator 1 for vehicle as an AC generator mounted in a vehicle. However, the invention may be applied to a rectifying and voltage regulating unit of other AC generator driven for rotation by a prime motor other than an engine mounted in a vehicle such as an internal combustion engine, electric motor, water wheel, wind-mill, etc.

In this embodiment, the AC input terminal 61 and the DC output terminal 65 integrally formed by one component as a connecting member is used, but the AC input terminal 61 and the DC output terminal 65 formed by joining two components by welding or the like may also be used as a connecting member.

Furthermore, a SiC-MOSFET provided with a semiconductor of silicon carbide and a surface insulator of heat-formed silicon oxide may be used as the power transistor of the hybrid IC 47 of the voltage regulator 3b. In such a case, heat generated by the hybrid IC (power transistor) 47 is minimal because of small resistance of SiC-MOSFET during its ON time. Consequently, the size of a cooling fan 48 of the voltage regulator 3b can be reduced in a longitudinal direction, enabling the consumption of an insulating member to be reduced for sealing the hybrid IC 47 with the same, as shown in FIGS. 9 or 10, and furthermore contributing to miniaturization of the voltage regulator 3b.

In addition, a range of choice for resin as suitable forming material can be widened because there will be no need of being concerned about the shorter life of a fitting member for the semiconductor device 74, for example, a solder metal due to its thermal fatigue, and also taking into consideration the radiation characteristics of the insulating member 90 for sealing the hybrid IC 47 in. Also, there will be no need of being concerned about failure of the unit due to heat transfer between the rectifier 3a and the voltage regulator 3b, and further flexibility in the arrangement of respective devices is increased. In place of SiC-MOSFET, other semiconductor switching device such as Si-MOSFET, bipolar transistor, etc. may also be used.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A rectifying and voltage regulating unit of an AC generator having stator coils and a field coil, said unit comprising:

a rectifier connected to said stator for rectifying said AC outputs of said stator coils into a DC output;

a voltage regulator connected to said field coil for regulating said output voltages of said stator coils by controlling current flowing through said field coil, at least one of said rectifier and said voltage regulator including a semiconductor device disposed in said holding member;

an external input/output terminal connected to said voltage regulator for exchange of electric signals between said voltage regulator and external devices;

a connecting member for electrically connecting said rectifier and said voltage regulator; and a holding member, having a member electrically insulating said external input/output terminals from said connecting member and covering large part of said connecting member, for holding said external input/output terminals and said connecting member, whereby said connecting member is secured without mechanically fastening together said rectifier and said voltage regulator, wherein said holding member comprises:

a terminal block covering said connecting member on a side of said rectifier;

a shield case covering said connecting member on a side of said voltage regulator; and a connector surrounding said external input/output terminals;

whereby said terminal block, said shield case and said connector are integrally molded with an insulating material.

2. A rectifying and voltage regulating unit of an AC generator according to claim 2, wherein said rectifier comprises:

a plurality of a first half-bridge semiconductor device and a second half-bridge semiconductor device;

a first cooling fin for holding and cooling said first-half bridge semiconductor device;

a second cooling fin, electrically insulated from said first cooling fin, for holding and cooling said second-half bridge semiconductor device.

3. A rectifying and voltage regulating unit of an AC generator according to claim 1, wherein said holding member comprises:

a first holding part made of a first electrically insulating material and forming a terminal block covering one part of said connecting member on said side of said rectifier;

a shield case covering the other part of said connecting member on a side of said voltage regulator; and a second holding part made of a second electrically insulating material different from said first material and forming a connector surrounding said external input/ output terminals.

4. A rectifying and voltage regulating unit of an AC generator according to claim 1, wherein said rectifier comprises a plurality of semiconductor switching devices capable of executing ON and OFF operation and rectifying said AC outputs.

5. A rectifying and voltage regulating unit of an AC generator according to claim 1, wherein said rectifier comprises a plurality of SiC MOSFETs and a cooling fin for cooling said SiC-MOSFETs.

6. A rectifying and voltage regulating unit of an AC generator according to claim 1, wherein said voltage regulator comprises:

a SiC-MOSFET which is turned ON and OFF for controlling exciting current flowing through said field coil; and cooling fins for cooling said SiC-MOSFET.

7. A method of making rectifying and voltage regulating unit of an AC generator including semiconductor devices comprising steps of:

forming an electrically conductive sheet into a plurality of patterns which include connecting member and said external input/output terminals and a lead frame in a predetermined shape and a member for mechanically supporting said predetermined shape;

electrically connecting said semiconductor devices to said terminal unit;

molding said semiconductor devices and said patterns into a mold unit with insulating material; and separating said mechanically supporting member from said mold unit.

8. A rectifying and voltage regulating unit of an AC generator according to claim 7, wherein said forming step includes a step of interposing a holding member between a sheet of metal and at least a part of said connecting member and internal input/output member.

* * * * *